(12) United States Patent
Abe et al.

(10) Patent No.: US 6,711,999 B2
(45) Date of Patent: Mar. 30, 2004

(54) SCREEN PRINTING APPARATUS

(75) Inventors: Seiko Abe, Kurume (JP); Seiichi Miyahara, Kurume (JP); Yuji Otake, Fukuoka (JP); Hirotoshi Sakamoto, Tosu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/283,531

(22) Filed: Oct. 30, 2002

(65) Prior Publication Data
US 2003/0084797 A1 May 8, 2003

(30) Foreign Application Priority Data
Nov. 2, 2001 (JP) ........................................ 2001-337691

(51) Int. Cl.[7] ................................................ B41M 1/12
(52) U.S. Cl. ........................ 101/129; 101/123; 427/282
(58) Field of Search ................................ 101/114, 116, 101/123, 129; 427/282; 118/406, 410

(56) References Cited

U.S. PATENT DOCUMENTS 4,622,239 A * 11/1986 Schoenthaler et al. ........ 427/96
6,158,338 A 12/2000 MacRaild et al.
6,171,399 B1 1/2001 Kaiser et al.

FOREIGN PATENT DOCUMENTS

| JP | 05-057870 | 3/1993 |
|---|---|---|
| JP | 2001-225443 | 8/2001 |

* cited by examiner

Primary Examiner—Ren Yan
(74) Attorney, Agent, or Firm—Pearne & Gordon LLP

(57) ABSTRACT

A screen printing apparatus in which a squeegee head 13 is moved on a mask plate 12 thereby to print paste on a substrate through pattern holes 12a, slide contact portions 37A and 37B form respectively front and rear walls in the squeegeeing direction of a printing space 35 which reserves cream solder 5 therein and makes the cream solder contact with the surface of the mask plate 12 through an opening portion formed at the lower surface thereof. Each of the slide-contact portions is configured by a partition plate 39 for partitioning between the printing space 35 and the outside and a filling block 38 having a filling surface 38a which forms an acute angle with respect to the surface of the mask plate 12. In the squeegeeing operation, the filling surface 38a rolls the cream solder 5. Thus, the cream solder 5 can be filled into the pattern holes 12a without pressurizing the cream solder, and a problem caused by the leakage of the cream solder can be eliminated.

13 Claims, 6 Drawing Sheets

SCREEN PRINTING APPARATUS

BACKGROUND OF THE INVENTION

The present invention relates to a screen printing apparatus for printing paste such as cream solder or conductive paste on a substrate.

In an electronic part mounting process, the screen printing process is employed as the method of printing paste such as cream solder or conductive paste on a substrate. This screen printing method is performed in a manner that a mask plate in which pattern holes are perforated in accordance with portions to be printed is set on a substrate and paste is printed on the substrate through the pattern holes of the mask plate by the squeegeeing process.

As the squeegeeing method for the screen printing, there is known the method of using the enclosed-type squeegee head. According to this method, unlike the usual screen printing method, paste is not directly supplied on a mask plate but a squeegee head reserving paste therein is employed. Conventionally, the enclosed-type squeegeeing head is employed in a manner that the paste within the squeegee head is pressurized by a pressurizing means such as a piston thereby to perform the filling operation of the paste within pattern holes mainly by the pressure.

However, according to the screen printing method using the conventional enclosed-type squeegeeing head, since the paste is always placed in a pressurized state in the squeegeeing process, a problem due to leakage of the paste likely occurs. For example, at the abutment portion between the upper surface of the mask plate and a blade provided at the lower surface of the squeegee head, the paste is prevented from bulging out by pressing the blade against the mask plate with a suitable surface pressure. However, the surface pressure value is not always constant and both the pressurizing state and the viscosity of the paste vary with time, so that it is difficult to prevent the leakage of the paste stably.

Further, the heights of the printing surface vary due to the presence of a resist layer depending on a substrate to be printed. Thus, when the mask plate is attached to such a substrate, a gap appears likely between the mask plate and the substrate. When the enclosed-type squeegee head is employed for the mask plate in such a state, there arises a problem that the pressurized paste bulges out and moves into the gap through the pattern holes. In this manner, the conventional enclosed-type squeegee head has the problem that the paste leaks or bulges out due to the pressurizing of the paste within the squeegee head.

SUMMARY OF THE INVENTION

Accordingly, an object of the invention is to provide a screen printing apparatus which can eliminate a problem caused by the leakage of paste and realize preferable printing.

The screen printing apparatus according to the invention is arranged in a manner that in the screen printing apparatus in which a squeegee head is moved on a mask plate thereby to print paste on a substrate through pattern holes of the mask plate, the screen printing apparatus comprises: horizontally moving means and elevation means for moving in a horizontal direction and elevating the squeegee head with respect to the mask plate; pressing means for pressing the squeegee head against the mask plate; a printing space which is provided at the squeegee head and reserves the paste therein and makes the paste contact with a surface of the mask plate through an opening portion formed at a lower surface of the printing space; a partition portion which forms front and rear walls in a squeegeeing direction of the printing space and partitions between the printing space and outside; and a filling portion which forms front and rear edges of the opening portion and fills the paste within the pattern holes in a squeegeeing process.

According to the invention, the screen printing apparatus is arranged to include the printing space which is provided at the squeegee head and reserves the paste therein and makes the paste contact with the surface of the mask plate through the opening portion formed at the lower surface of the printing space; the partition portion which forms the front and rear walls in the squeegeeing direction of the printing space and partitions between the printing space and the outside; and the filling portion which forms the front and rear edges of the opening portion and fills the paste within the pattern holes in the squeegeeing process. Thus, the paste can be filled into the pattern holes without pressurizing the paste, and the problem caused by the leakage of the paste can be eliminated and preferable printing can be realized.

DETAILED DESCRIPTION OF THE PREFERRED EMBODIMENTS

Figure 1:
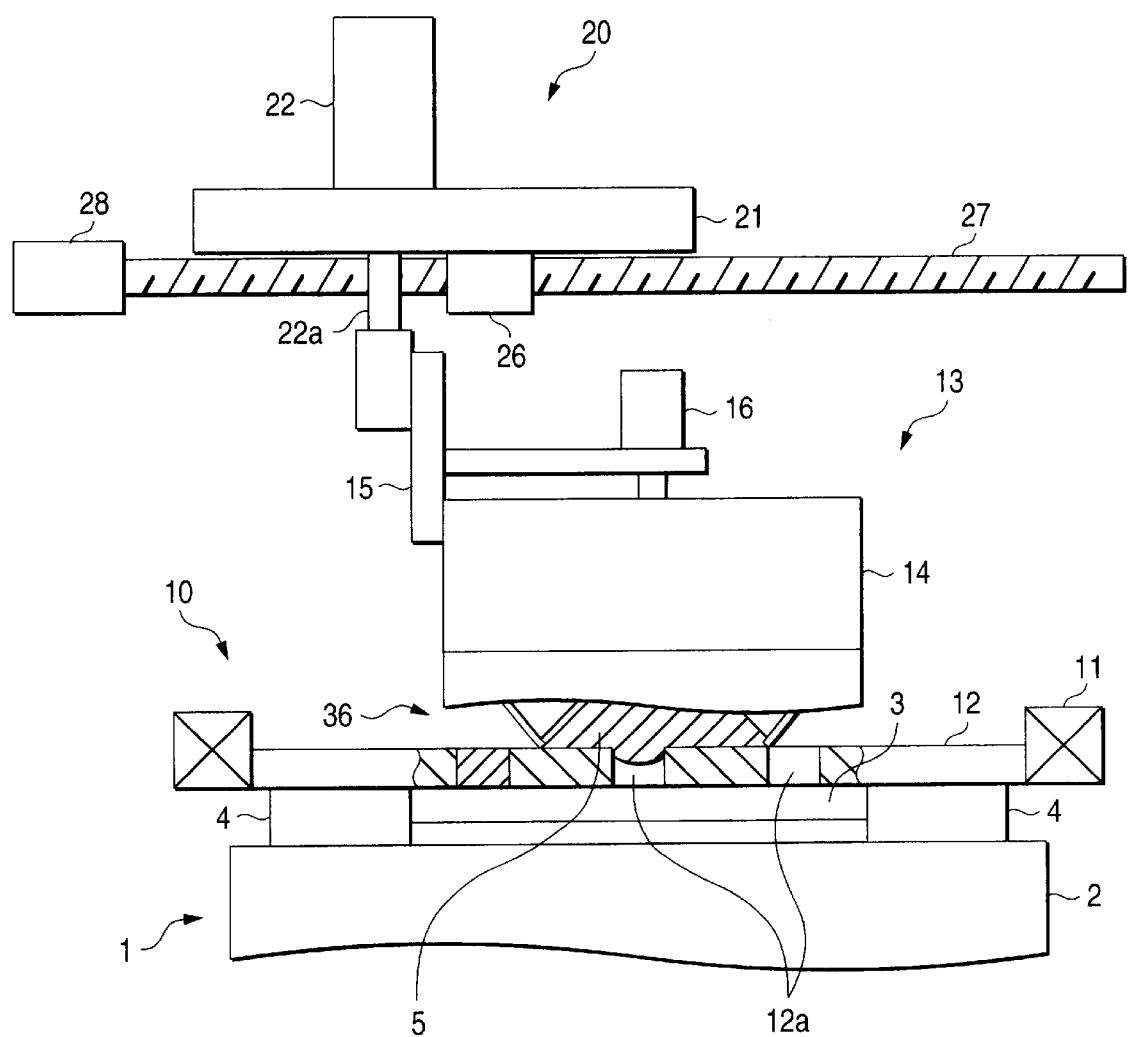
FIG. 1 is a front view of the screen printing apparatus according to the embodiment of the invention.
Figure 2:
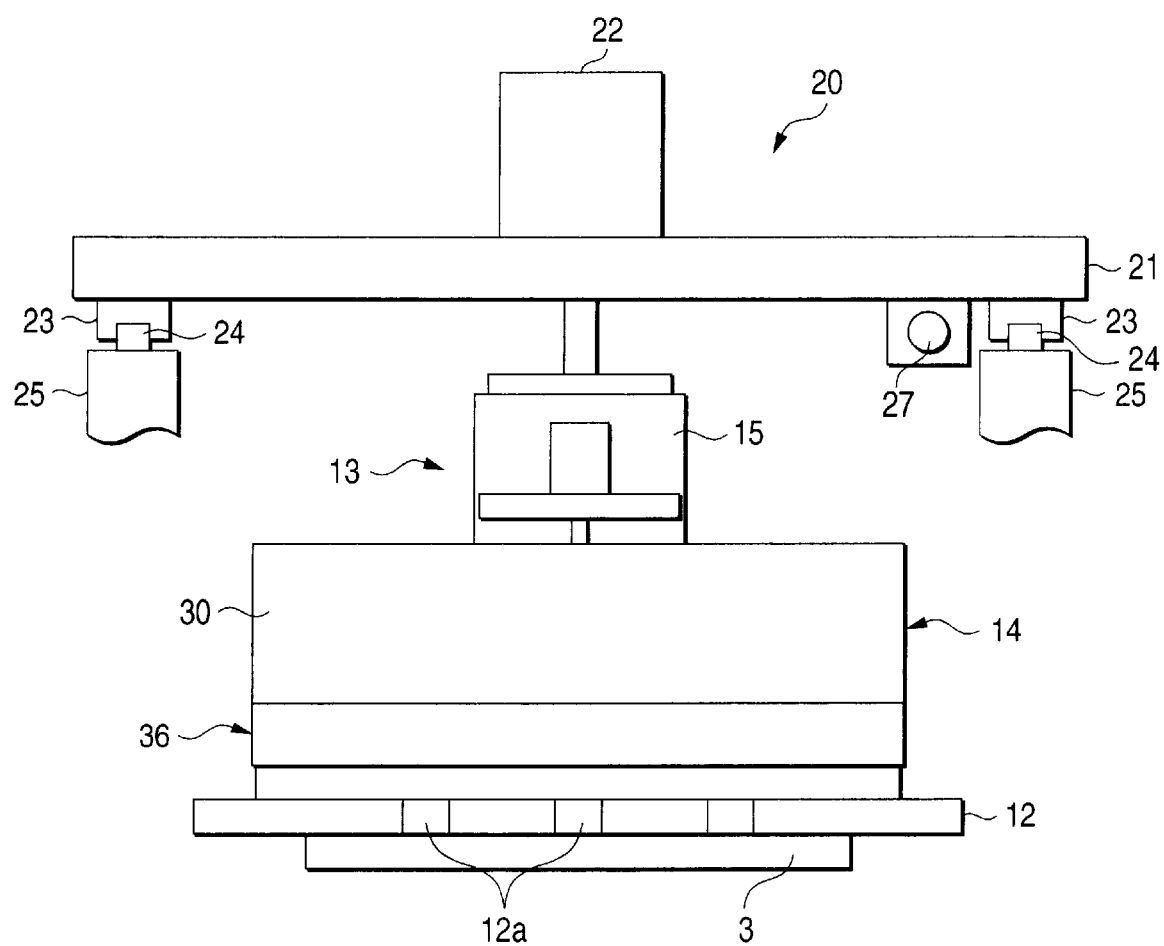
FIG. 2 is a side view of the screen printing apparatus according to the embodiment of the invention.
Figure 3:
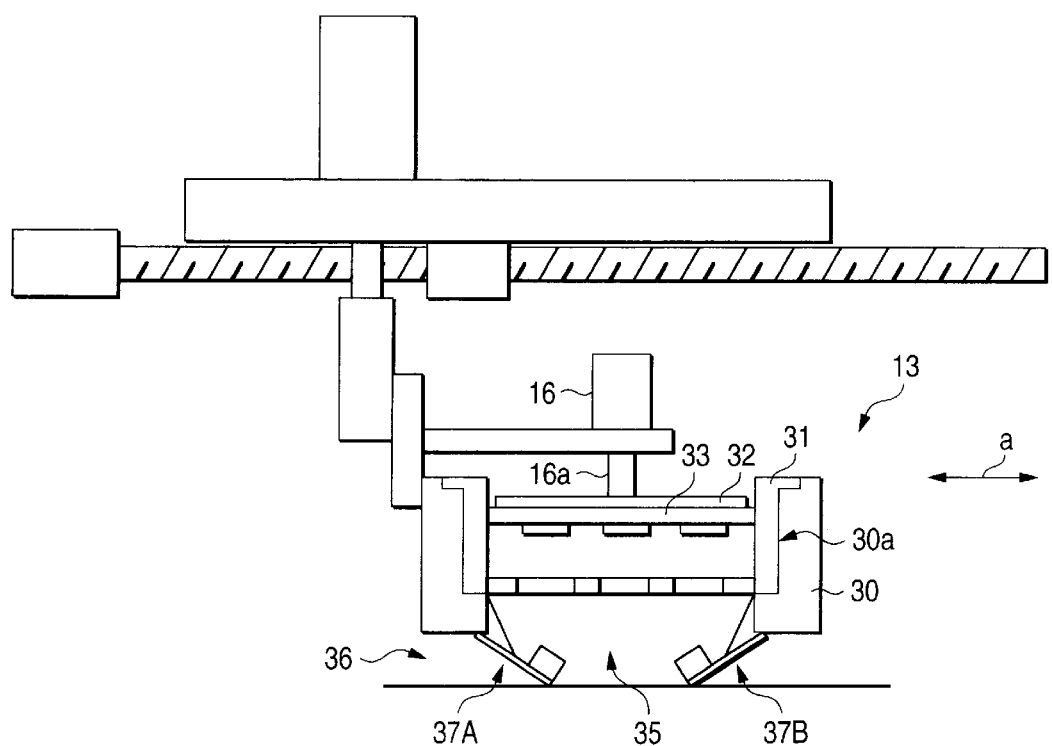
FIG. 3 is a sectional view of a part of the squeegee head of the screen printing apparatus according to the embodiment of the invention.
Figure 4:
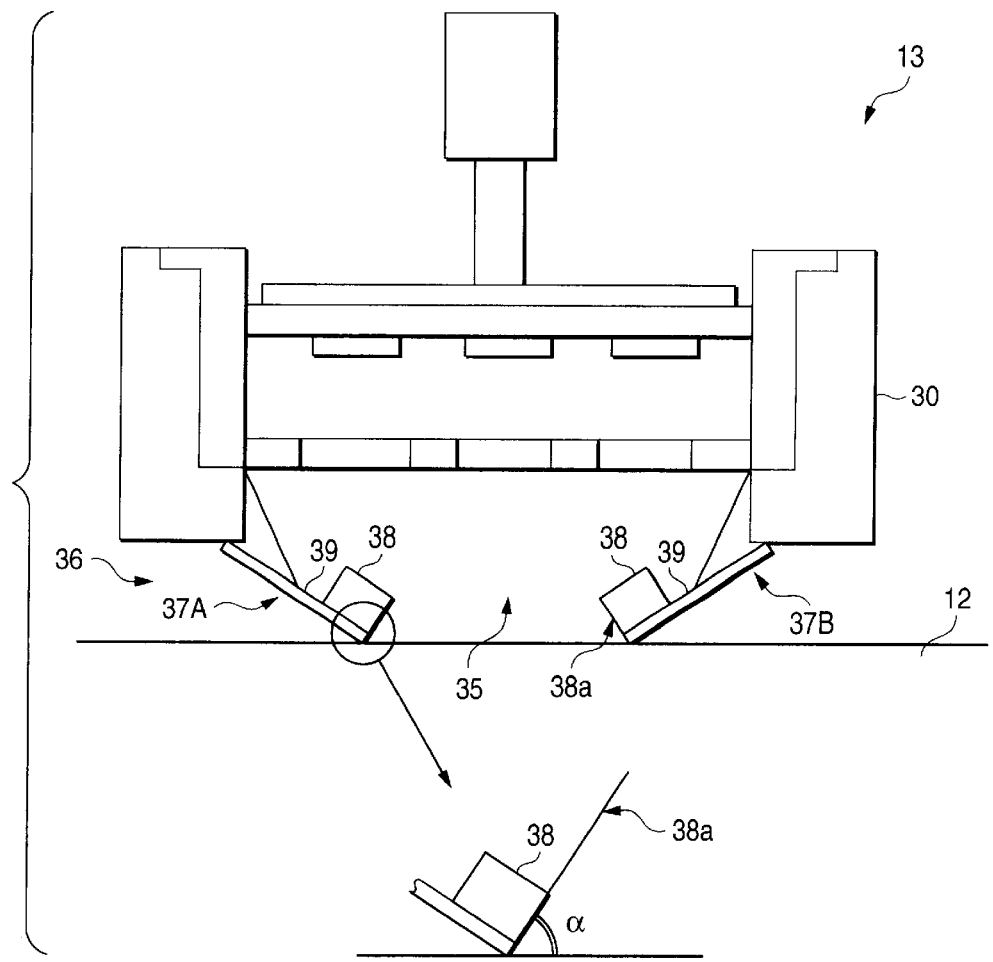
FIG. 4 is a sectional view of a part of the squeegee head of the screen printing apparatus according to the embodiment of the invention.
Figure 5A:
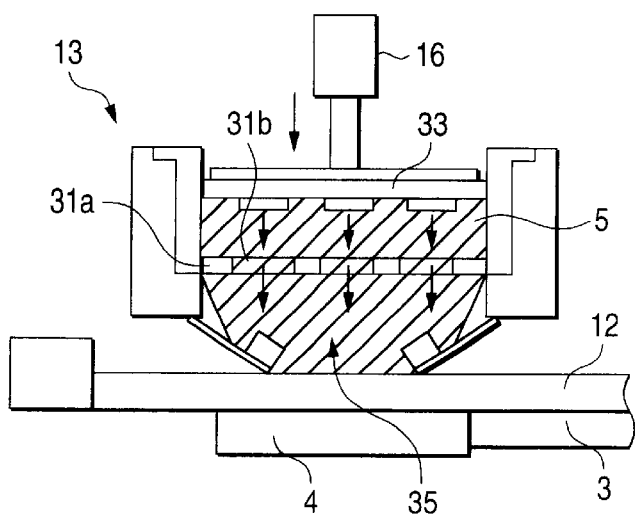
FIGS. 5A to 5C are diagrams for explaining the operation of the screen printing apparatus according to the embodiment of the invention.
Figure 6:
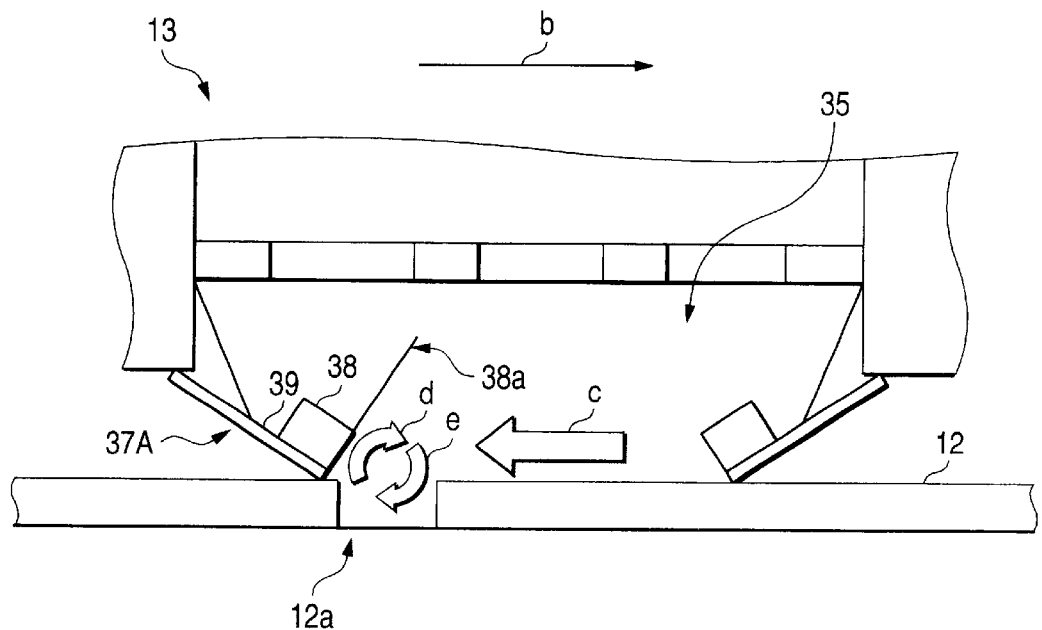
FIG. 6 is a diagram for explaining the operation of the screen printing apparatus according to the embodiment of the invention.
Figure 7:
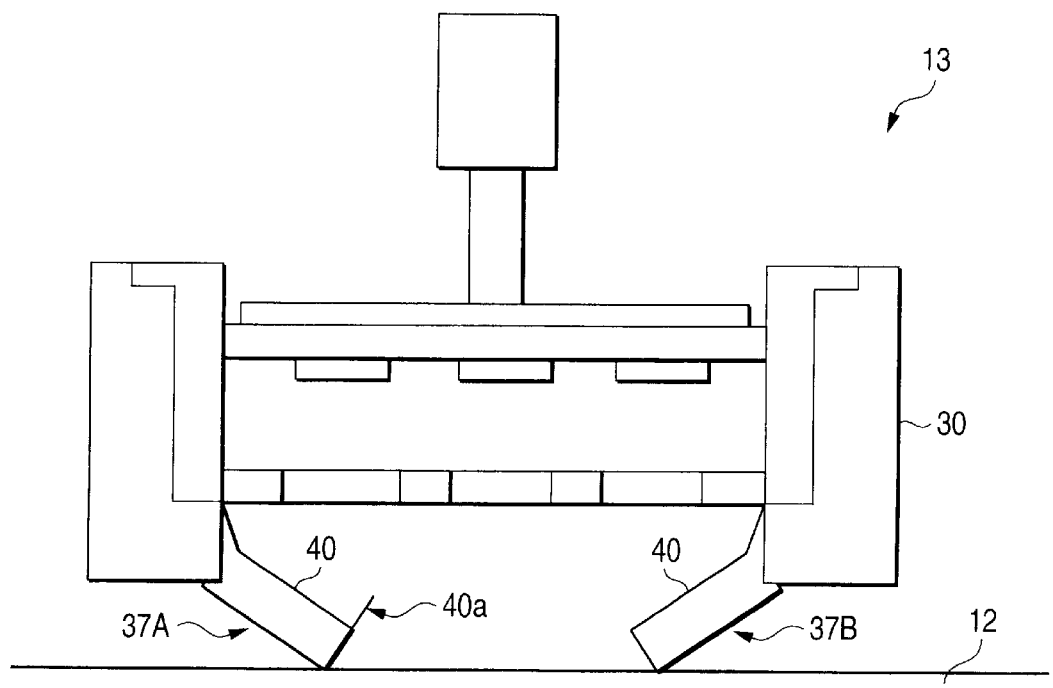
FIG. 7 is a sectional view of a part of the squeegee head of the screen printing apparatus according to the embodiment of the invention.

Next, the embodiment of the invention will be explained with reference to the accompanying drawings. FIG. 1 is a front view of the screen printing apparatus according to the embodiment of the invention, FIG. 2 is a side view of the screen printing apparatus according to the embodiment of the invention, FIGS. 3, 4 and 7 are sectional views of a part of the squeegee head of the screen printing apparatus according to the embodiment of the invention, and FIGS. 5 and 6 are diagrams for explaining the operation of the screen printing apparatus according to the embodiment of the invention.

First, the structure of the screen printing apparatus will be explained with reference to FIG. 2. In FIGS. 1 and 2, a positioning portion 1 for a substrate is configured by disposing a substrate holding portion 2 on a not-shown moving table. A substrate 3 being subjected to the screen printing is held by the clamper 4 of the substrate holding portion 2. The substrate 3 thus held by the damper 4 of the substrate holding portion 2 is positioned in the horizontal and vertical directions by driving the moving table.

A screen mask 10 is disposed above the positioning portion 1. The screen mask 10 is configured by attaching a mask plate 12 to a holder 11. Pattern holes 12a are perforated at the mask plate 12 in correspondence with the printing portions of the substrate 3 to be printed.

A squeegee head 13 is disposed on the screen mask 10 so as to be elevated freely by a head elevation portion 20. The head elevation portion 20 is provided with a cylinder 22 which is erected from the upper surface of a plate member 21. The squeegee head 13 is coupled through a coupling member 15 to the lower end portion of the rod 22a of the cylinder 22.

When the cylinder 22 is driven, the squeegee head 13 moves elevationally with respect to the mask plate 12 and is urged against the mask plate 12. The head elevation portion 20 serves as an elevation means for elevationally moving the squeegee head 13 with respect to the screen mask 10. The cylinder 22 serves as a pressing means for pressing the squeegee head 13 against the mask plate 12.

Sliders 23 are fixed at the both end portions of the lower surface of the plate member 21 of the head elevation portion 20, respectively. The sliders 23 are fitted into guide rails 24 disposed on the upper surface of a frame 25 so as to slide there along freely, respectively. A nut 26 is coupled to the lower surface of the plate member 21. A feed screw 27 screwed with the nut 26 is driven to rotate by means of a motor 28.

When the motor 28 is driven, the plate member 21 moves in the horizontal direction, whereby the squeegee head 13 coupled to the head elevation portion 20 also moves in the horizontal direction. When the motor 28 is driven in a state where the squeegee head 13 is lowered, the squeegee head 13 moves in the horizontal direction on the mask plate 12. That is, the motor 28, the feed screw 27 and the nut 26 serve as a horizontally moving means for moving the squeegee head 13 in the horizontal direction on the mask plate 12.

The squeegee head 13 is provided at the lower portion thereof with a printing portion 14 which abuts against the surface of the mask plate 12 to fill cream solder 5 as the paste into the pattern holes 12a. The structure of the printing portion 14 will be explained with reference to FIG. 3. In FIG. 3, a reference numeral 30 depicts a main body portion which is a block-shaped portion elongated in the width direction of the mask plate 12. The length of the main body portion 30 is set to cover the width of the substrate 3 to be printed, as shown in FIG. 2. The main body portion 30 is provided with a concave portion 30a in which a cartridge 31 reserving the cream solder 5 therein is fitted so as to be detachable freely.

The cartridge 31 serves as a reservoir portion for the cream solder (paste reservoir portion) in which a predetermined amount of the cream solder is reserved. The cartridge is attached to the main body portion 30 at the time of printing. A pressurizing plate 33 for pressurizing the cream solder 5 within the cartridge is fitted into the opening of the upper surface of the cartridge 31. The pressurizing plate 33 abuts against a push-down member 32 coupled to the rod 16a of a cylinder 16 disposed above the pressurizing plate. The pressurizing plate 33 is arranged to elevationally move within the cartridge 31 by means of the push-down member 32 when the cylinder 16 is driven.

The bottom surface of the cartridge 31 serves as an extruding plate 31a for the cream solder. The extruding plate 31a is provided with many openings 31b. When the cylinder 16 pushes down the pressurizing plate 33, the cream solder 5 within the cartridge 31 is pressurized and so pushed out downward through the openings 31b of the extruding plate 31a. The cylinder 16 and the pressurizing plate 33 serve as a paste pressurizing means for pressurizing the cream solder 5 as the paste.

Next, the explanation will be made as to a squeegeeing portion 36 and a printing space 35. The squeegeeing portion 36 is formed by four wall surfaces which are directed in the four directions respectively so as to surround the periphery beneath the main body portion 30 and to form the printing space 35 within these wall surfaces. At the both ends of the squeegeeing portion 36 along the squeegeeing direction (a direction shown by an arrow a), there are disposed two slide contact portions 37A and 37B which are opposed to each other and form the front and rear wall surfaces of the printing space 35, respectively. At the time of printing, the printing space 35 reserves the pressurized cream solder 5 therein and makes the cream solder 5 contact with the surface of the mask plate 12 through the lower surface of the printing space 35, that is, an opening portion between the two slide contact portions 37A and 37B.

As shown in FIG. 4, the slide contact portions 37A and 37B are protrusively provided toward the lower direction from the lower surface of the main body portion 30. The slide-contact portions are formed by partition plates 39 each slanted toward the inner portion of the printing space 35 from the lower surface of the main body portion and filling blocks 38 which are held on the upper surfaces of the lower end portions of the partition plates 39 and form the front and rear edges of the opening portion of the lower surface of the printing space 35, respectively. In a state where the squeegee head 13 is lowered on the upper surface of the mask plate 12, the lower end portion of the partition plate 39 (a partition portion) abuts against the upper surface of the mask plate 12 thereby to partition between the printing space 35 and the outside. The filling block 38 (a filling portion) has a filling surface 38a which forms an acute angle a with respect to the surface of the mask plate 12. In the squeegeeing operation, the filling surface 38a rolls the cream solder 5 within the printing space 35.

Next, the operation of the screen printing apparatus will be explained with reference to FIGS. 5A to 5C and 6. FIG. 5A shows a state where the squeegee head 13 reserving the cream solder 5 therein is lowered with respect to the mask plate 12 and positioned on the damper 4 in order to perform the print preparing operation. In the print preparing operation, the cylinder 16 is driven to lower the pressurizing plate 33 thereby to pressurize the cream solder 5 within the squeegee head. In response to the pressurizing operation, the cream solder 5 moves downward through the holes 31b of the extruding plate 31a. Thus, the printing space 35 is completely filled by the cream solder 5.

Figure 5B:
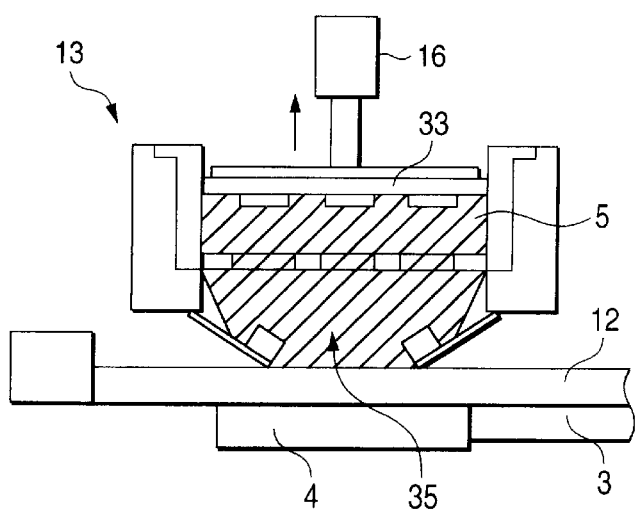
Figure 5C:
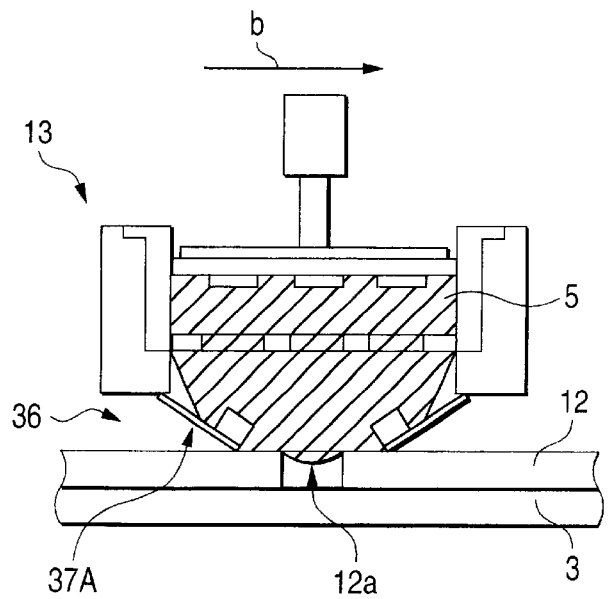

Thereafter, as shown in FIG. 5B, the cylinder 16 is operated to move the pressurizing plate 33 upward (or the pressurizing operation by the cylinder 16 is stopped) thereby to stop the pressurizing operation to the cream solder 5. Thus, the cream solder 5 within the printing space 35 is released from the pressurized state thereby to place in a state of capable of performing the squeegeeing operation by the squeegee head 13. Thereafter, the cylinder 22 presses the squeegee head 13 against the mask plate 12 with a predetermined pressing load. In such a pressing state, the squeegee head 13 is shifted in a direction shown by an arrow b thereby to print the cream solder 5 on the substrate 3 through the pattern holes 12a.

The flowing state of the cream solder 5 in the squeegeeing operation will be explained with reference to FIG. 6. When the squeegee head 13 is shifted in the direction shown by the arrow b, the cream solder 5 moves within the printing space 35 in a direction shown by an arrow c relatively with respect to the slide contact portion 37A (the slide-contact portion on the rear side in the squeegeeing direction). According to the relative movement, the cream solder 5 near the surface of the mask plate 12 flows in a rolling manner as shown by arrows d and e due to the presence of the filling surface 38a of the filling block 38. When the filling block 38 passes over the pattern hole 12a, the cream solder 5 moves into the pattern hole 12a due to the rolling flow of the cream solder thereby to be filled into the pattern hole 12a.

In the printing operation of the enclosed-type squeegee head 13, the cream solder 5 is filled within the pattern holes 12a by utilizing the rolling flows caused by the filling surfaces 38a of the filling blocks 38, so that it is not necessary to pressurize the cream solder 5 within the printing space 35.

Therefore, the pressure within the printing space 35 is stable at a quite low pressure. Thus, when the pressing value of the cylinder 22 is set to a suitable value, the cream solder 5 can be prevented from leaking effectively from the slide-contact portion between the lower end portion of the partition plate 39 and the upper surface of the mask plate 12. Further, even in a case where there is a slight step portion on the upper surface of the substrate 3 and so a gap exists between the lower surface of the mask plate 12 and the upper surface of the substrate 3, the cream solder 5 within the printing space 35 is not placed in a pressurized state, so that there does not arise such a problem that the pressurized cream solder 5 bulges out and flows into the gap through the pattern holes 12a.

That is, it is possible to prevent the problem caused by the bulging-out and the leakage of the cream solder 5 which could not be avoided in the conventional enclosed-type squeegee head in which the cream solder 5 is filled within the pattern holes 12a by pressurizing the cream solder 5 within the squeegee head.

The aforesaid embodiment is configured in a manner that the filling blocks 38 are held by the partition plates 39, respectively. Alternatively, as shown in FIG. 7, each of the slide contact portions 37A and 37B may be formed by a single plate-shaped partition block 40 (a partition portion) with a thick thickness and the lower end surface 40a (with the similar shape as the filling surface 38a shown in FIG. 4) of the partition block 40 may be used as a filling surface. That is, in the example of FIG. 7, the partition block 40 is configured so as to serve as both the partition portion and the filling portion.

As described above, according to the invention, the screen printing apparatus is arranged to include the printing space which is provided at the squeegee head and reserves the paste therein and makes the paste contact with the surface of the mask plate through the opening portion formed at the lower surface of the printing space; the partition portion which forms the front and rear walls in the squeegeeing direction of the printing space and partitions between the printing space and the outside; and the filling portion which forms the front and rear edges of the opening portion and fills the paste within the pattern holes in the squeegeeing process. Thus, the paste can be filled into the pattern holes without pressurizing the paste, and the problem caused by the leakage of the paste can be eliminated and preferable printing can be realized.

What is claimed is:

1. A screen printing method in which a squeegee head is moved on a mask plate thereby to print paste on a substrate through pattern holes of the mask plate, the screen printing method comprising the steps of:
    a step of pressurizing the paste within a paste reservoir portion of the squeegee head thereby to lower the paste;
    a step of filling the paste within a printing space through the lowering of the paste;
    a step of releasing pressurizing state of the paste after filling the paste within the printing space and prior to filling the paste within the pattern holes;
    a step of pressing the squeegee head against the mask plate; and
    a step of moving the squeegee head in a horizontal direction thereby to make a filling portion provided below the printing space fill the paste within the pattern holes.

2. A screen printing method according to claim 1, wherein the paste is rolled by a filling surface of the filling portion.

3. A screen printing method according to claim 1, wherein a first cylinder is employed to pressurize the paste within a paste reservoir portion.

4. A screen printing method according to claim 1, wherein a second cylinder is employed to press the squeegee head against the mask plate.

5. A screen printing method according to claim 1, further comprising employing a removable cartridge as the paste reservoir portion.

6. A screen printing method according to claim 1, wherein a pressurizing plate is employed to pressurize the paste within the paste reservoir portion.

7. A screen printing method comprising the steps of:
    filling a paste reservoir portion located within a squeegee head with paste;
    applying pressure to the paste until a printing space is filled with paste, the printing space being located between the paste reservoir portion and a top surface of a mask plate;
    releasing the pressure on the paste; and
    filling at least one pattern hole with the paste without pressurizing the paste within the printing space.

8. A screen printing method according to claim 7, wherein releasing the pressure on the paste comprises moving a pressurizing plate upward.

9. A screen printing method according to claim 7, wherein releasing the pressure on the paste comprises stopping a pressurizing operation by a cylinder.

10. A screen printing method according to claim 7, further comprising pressing the squeegee head against the mask plate with a predetermined pressing load.

11. A screen printing method according to claim 10, further comprising shifting the squeegee head in a horizontal direction to print the paste on a substrate through the at least one pattern hole.

12. A screen printing method according to claim 11, wherein the paste is filled within the at least one pattern hole by utilizing a rolling flow caused by a filling block coupled to the squeegee head.

13. A screen printing method according to claim 12, wherein the filling block comprises a filling surface to roll the paste into the at least one pattern hole.

* * * * *

UNITED STATES PATENT AND TRADEMARK OFFICE
CERTIFICATE OF CORRECTION

PATENT NO. : 6,711,999 B2
DATED : March 30, 2004
INVENTOR(S) : Seiko Abe et al.

It is certified that error appears in the above-identified patent and that said Letters Patent is hereby corrected as shown below:

Column 2,
Line 64, please delete "damper", and insert therefor -- clamper --.

Column 3,
Line 24, please delete "there along", and insert therefor -- therealong --.

Column 4,
Line 36, please delete "a", and insert therefor -- α --.
Line 44, please delete "damper", and insert therefor -- clamper --.

Signed and Sealed this

Thirty-first Day of August, 2004

JON W. DUDAS
*Director of the United States Patent and Trademark Office*